United States Patent
Nakatani et al.

(10) Patent No.: US 8,762,926 B2
(45) Date of Patent: Jun. 24, 2014

(54) METHOD AND APPARATUS FOR DIAGNOSING A FAULT OF A MEMORY USING INTERIM TIME AFTER EXECUTION OF AN APPLICATION

(71) Applicant: Kabushiki Kaisha Toshiba, Tokyo (JP)

(72) Inventors: Hiroshi Nakatani, Tokyo (JP); Naoya Ohnishi, Tokyo (JP); Satoru Amaki, Tokyo (JP); Yoshito Sameda, Kanagawa-ken (JP); Makoto Toko, Saitama-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/754,444

(22) Filed: Jan. 30, 2013

(65) Prior Publication Data

US 2014/0095949 A1    Apr. 3, 2014

(30) Foreign Application Priority Data

Sep. 28, 2012   (JP) .................. 2012-218788

(51) Int. Cl.
*G06F 17/50* (2006.01)

(52) U.S. Cl.
USPC ............ 716/136; 716/112; 716/113; 716/134

(58) Field of Classification Search
USPC .................. 716/112–113, 134, 136
See application file for complete search history.

(56) References Cited

U.S. PATENT DOCUMENTS

| | | | | |
|---|---|---|---|---|
| 4,597,080 A | * | 6/1986 | Thatte et al. .................. | 714/726 |
| 4,715,034 A | * | 12/1987 | Jacobson ...................... | 714/719 |
| 6,563,751 B1 | * | 5/2003 | Wu ............................... | 365/201 |
| 7,716,542 B2 | * | 5/2010 | Chang et al. .................. | 714/718 |
| 2009/0089631 A1 | | 4/2009 | Kanamaru et al. | |

FOREIGN PATENT DOCUMENTS

WO    WO 2007/055068 A1    5/2007

* cited by examiner

*Primary Examiner* — Naum Levin
(74) *Attorney, Agent, or Firm* — Holtz, Holtz, Goodman & Chick PC

(57) ABSTRACT

An area of a memory has a diagnosis area and a non diagnosis area, with the diagnosis area divided into a plurality of Row areas which do not overlap each other, and each of the Row areas is divided into a plurality of Cell areas which do not overlap each other. A memory fault diagnostic method has a diagnostic step in a Row area to diagnose between Cell areas with respect to all the combinations of a set of Cell areas in the Row area, and a diagnostic step between Row areas to diagnose between Row areas with respect to all the combinations of a set of Row areas in the diagnosis area. A Row area size is determined to be a size in which a time of the diagnosis in a Row area becomes equal to a time of the diagnosis between Row areas.

12 Claims, 7 Drawing Sheets

(b)

(c)

METHOD AND APPARATUS FOR DIAGNOSING A FAULT OF A MEMORY USING INTERIM TIME AFTER EXECUTION OF AN APPLICATION

CROSS-REFERENCE TO RELATED APPLICATION

This application is based upon and claims the benefit of priority from the prior Japanese Patent Application No. 2012-218788, filed on Sep. 28, 2012, the entire contents of which are incorporated herein by reference.

FIELD

Embodiments described herein generally relate to a memory fault diagnostic device, a memory fault diagnostic method.

BACKGROUND

In safety instrumentation systems of plants and so on in which a high level of safety is required, for example, fault diagnosis for a memory of a controller to control the system is required.

Since a continuous operation without restart is required for safety instrumentation systems for a long time of year units, it is necessary to perform fault diagnosis for the memory not only at the time of starting up the system but also in operation.

Generally, as faults of a memory which becomes a fault diagnostic object, in addition to a read and write (Read/Write) error of a memory cell, there is a coupling fault that when a certain memory cell is Read/Written the value of another memory cell changes.

As fault diagnostic algorithms for this coupling fault, there are Walkpath (called also Walking Bit) and GALPAT.

Walkpath is a method which tests, while the value of a focused memory cell of a bit or a plurality of bits is turned ON/OFF across the whole memory area of a diagnostic object, whether or not the values of the remaining memory area are correct.

Though this method can detect a coupling fault in the whole memory area, since the number of times of read and write (Read/Write) of the memory is proportional to the square of the memory size, there is a problem that a fault diagnostic time increases at an accelerating speed if the capacity of a memory of a diagnosis object becomes large.

For this problem, as a method to shorten the processing time required for memory fault diagnosis, there is a method to hierarchically set a fault diagnosis area of the memory to thereby reduce the number of memory access times (refer to Japanese Patent Publication No. 4312818, for example).

DETAILED DESCRIPTION

A memory fault diagnostic method of the present embodiment is a memory fault diagnostic method to diagnose a fault of a memory using an interim time after execution of an application in a predetermined control cycle, an area of a memory comprises a diagnosis area and a non diagnosis area, the diagnosis area is divided into a plurality of Row areas in which the respective areas do not overlap to each other, and furthermore, each of the Row areas is divided into a plurality of Cell areas in which the respective areas do not overlap to each other, the memory fault diagnostic method is diagnosis composed of two hierarchies of a diagnostic step in a Row area to diagnose between Cell areas with respect to all the combinations of a set of Cell areas in the Row area, and a diagnostic step between Row areas to diagnose between Row areas with respect to all the combinations of a set of Row areas in the diagnosis area, and a Row area size is determined to be a size in which a time of the diagnosis in a Row area becomes equal to a time of the diagnosis between Row areas.

Hereinafter, embodiments of the present invention will be described with reference to the drawings. It is only necessary that a memory fault diagnostic device of the present embodiment is provided with a CPU to execute an application and a memory to store a program which the CPU executes and data, and a controlled object for which the application is executed may be any device.

First Embodiment

Figure 1:
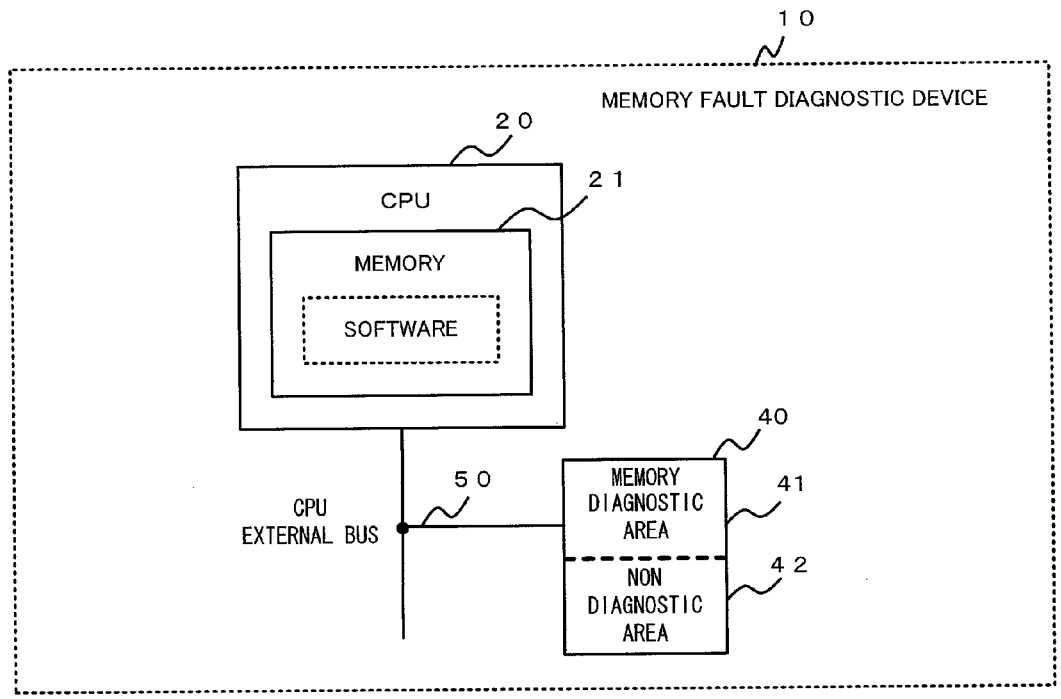
FIG. 1 A block diagram of a controller of a first embodiment.
Figure 2:
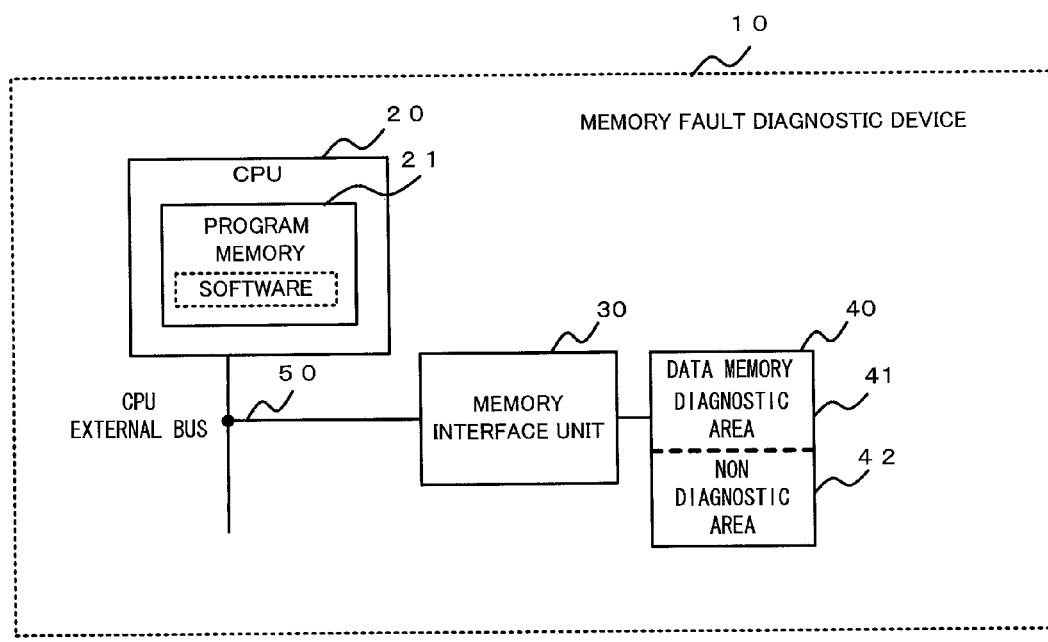
FIG. 2 A block diagram of another configuration of the controller of the first embodiment.

A first embodiment will be described with reference to FIG. 1-FIG. 10. FIG. 1 and FIG. 2 are block configuration diagrams for describing the first embodiment. A memory fault diagnostic device 10 is provided with a CPU 20 and a memory 40, and the CPU 20 and the memory 40 are connected by a CPU external bus 50.

The CPU 20 is provided with a memory 21 which stores software provided with an application software (hereinafter, called an application) to execute an application, and a memory fault diagnostic software (hereinafter, called memory fault diagnosis) to diagnose a fault of the memory 40.

In addition, the memory 40 is provided with a predetermined diagnosis area 41 which becomes a diagnostic object for a memory fault, and a non diagnosis area 42 which does not become an object of a diagnostic object but becomes a temporary save memory area for fault diagnosis of the diagnostic area 41.

The memory fault diagnostic device 10 may be of a configuration provided with a CPU core and an internal memory (not shown) in which the CPU core and the internal memory are connected by a CPU internal bus.

In addition, the memory fault diagnostic device 10 may be of a configuration in which the CPU 20 and the memory 40 are directly connected by the CPU external bus 50 as shown in FIG. 1, or may be of a configuration in which the CPU 20 and the memory 40 are connected through a memory interface unit 30 as shown in FIG. 2.

In addition, the CPU 20 of the configuration of FIG. 2 is, in place of the configuration provided with the software 21, may be of a configuration which is composed of an FPGA (Field-Programmable Gate Array) and executes the application and the memory fault diagnosis by the FPGA.

In addition, though the inside of the memory 40 is divided into the diagnosis area 41 and the non diagnosis area 42, the both areas may be arranged on the same physical memory, or the diagnosis area 41 and the non diagnosis area 42 may be composed of different physical memories.

Figure 3:
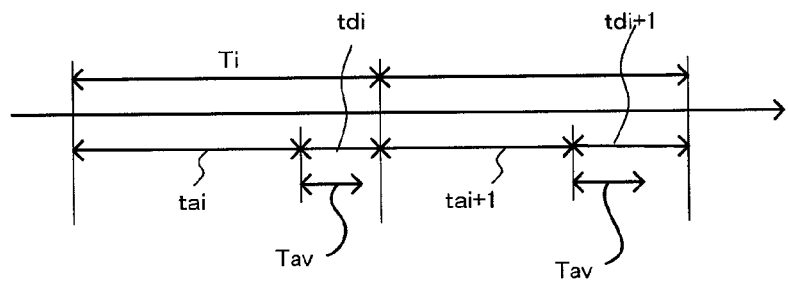
FIG. 3 A timing chart of an application processing and a memory diagnostic processing.

Next, the outline of the operation of this memory fault diagnostic device 10 will be described with reference to FIG. 3 and FIG. 4. FIG. 3 shows execution timings of a predetermined control cycle Ti which the CPU 20 executes, a processing time tai of an application which is executed in the control cycle Ti, and an interim time tdi in which the memory fault diagnosis can be executed.

With respect to the interim time tdi, in consideration of the variation in the application processing times tai, an allowable diagnostic time Tam which is usable for the memory fault diagnosis is previously determined.

In addition, the memory 40 which becomes an object for the memory fault diagnosis, whose detail will be described later, is provided with the predetermined diagnosis area 41 which becomes a diagnostic object, and the non diagnosis area 42 which is an area except for the diagnostic object and is not used in the memory fault diagnosis.

Figure 4:
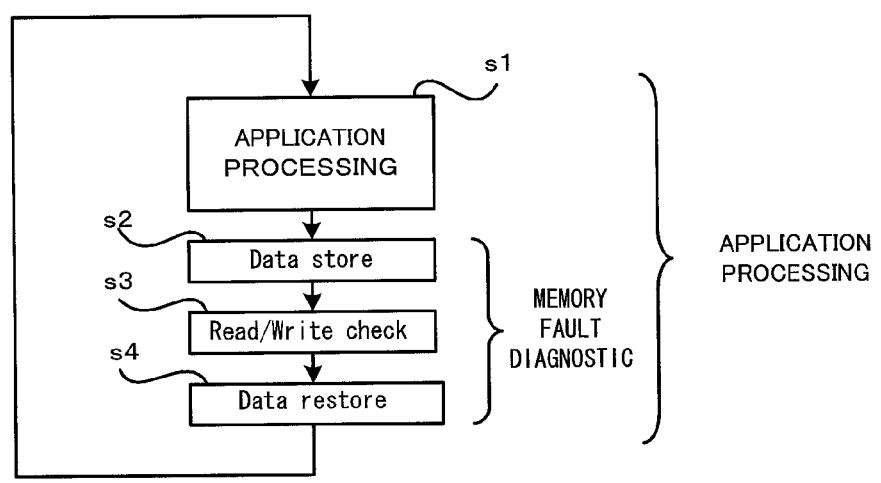
FIG. 4 A flow chart of the application processing and the memory diagnostic processing.

And, as shown in FIG. 4, the CPU 20 repeatedly executes an application processing s1 and an memory fault diagnostic processing s2-s4. The memory fault diagnostic processing is composed of Date Store (s2) to temporarily save a certain area of the diagnosis area 41 to the non diagnosis area, Read/Write Check (s3) which, with respect to the relevant area, writes and reads predetermined pattern data and checks whether or not the read data is data of expectation values, and Date restore (s4) to write back the data of the certain diagnosis area which has been temporarily saved.

And, the memory fault diagnostic processings are repeatedly executed across a plurality of the control cycles Ti.

Next, the configuration of the memory 40 will be described with reference to FIG. 5. The memory 40 is a volatile memory in which data is writable and readable, and is composed of a random access memory (RAM), and a Dynamic RAM (DRAM) which is composed of a transistor and requires refresh charge, or a Static RAM (SRAM) which is composed of several transistors and is accessible at a high speed is used.

On the other hand, as the memory to store the software 21 provided in the CPU 20, a nonvolatile Read Only Memory (ROM) is used.

Figure 5:
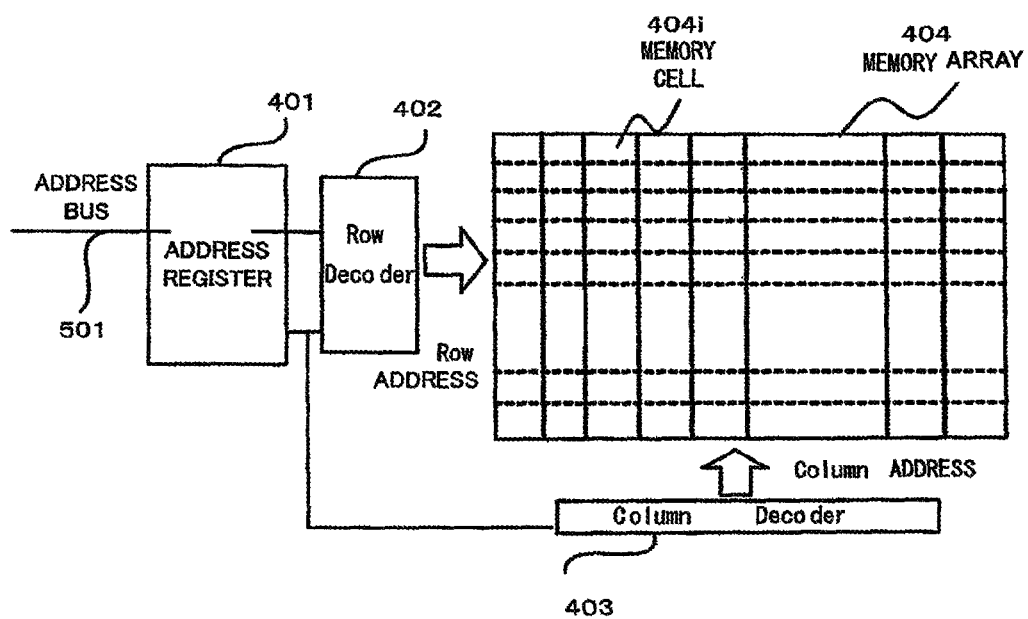
FIG. 5 An example of a configuration diagram of a memory.

As shown in FIG. 5, the configuration of a commonly used RAM is provided with an address register 401 to be connected to an address bus 501 of the CPU 20, and a row decoder (Row Decoder) 402 and a column decoder (Column decoder) 403 which designate an access to a memory cell 404i for a row address (Row address) and a column address (Column address) of each memory cell 404i of a memory array 404.

Each row (Row) is called a word line, and each column (Column) is called a bit line, an intersection point of an word line and a bit line is considered to be one address for a memory cell, and by matching a physical address with a logical address, it is possible to access the address designated by the row decoder 402, the column decoder 403.

In the fault of the memory 40, faults of the respective constituent portions are included, and in the fault of the memory cell 404i, in addition to a coupling fault (Coupling fault) which occurs because address lines and data lines are arranged closely, and a large number of memory cells are arranged closely, faults called a stuck-at fault and a pattern sensitive fault are also included.

The fault of the memory 40 including the coupling fault like this, since the content of another memory cell changes by the content of a certain memory cell or when the content of a certain memory cell changes, can be diagnosed by applying a diagnostic algorithm called GALPAT.

That is, after 0 (or 1) is written into one memory cell out of a set of memory cells to be diagnosed, the content of another memory cell at the same bit data position is changed from 0→1 (or 1→0), and then the content of the one memory cell is read out, and the values of the set of the memory cells are compared with the expectation values for diagnosis.

Figure 6:
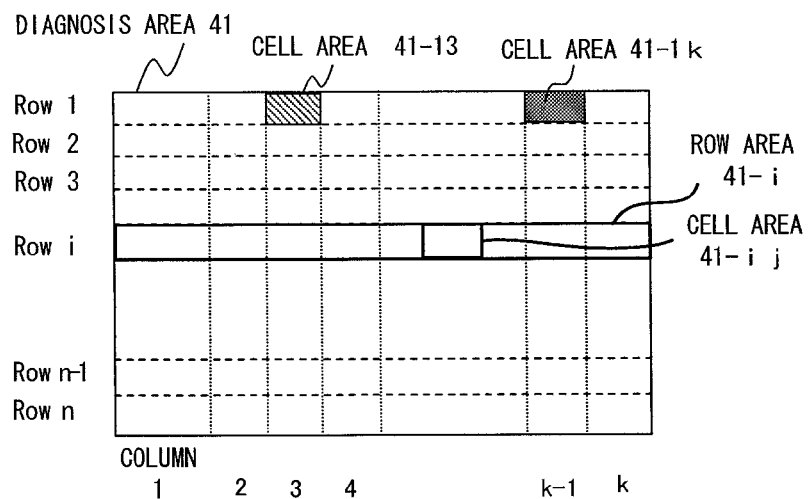
FIG. 6 A diagram for describing setting of an area for the diagnosis in a Row area of the first embodiment and its operation.
Figure 7:
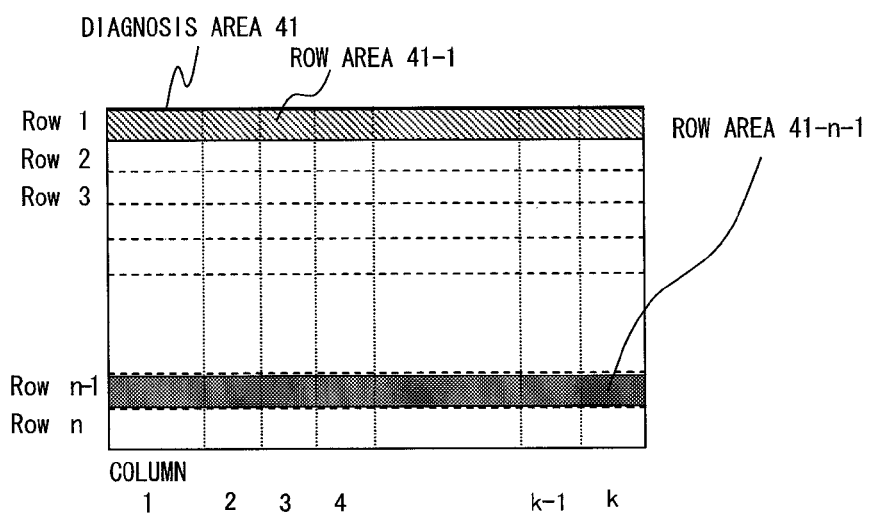
FIG. 7 A diagram for describing setting of an area for the diagnosis between Row areas of the first embodiment and its operation.

Next, a setting method of the diagnosis area 41 of the memory 40, based on the diagnostic algorithm by GALPAT like this, will be described with reference to FIG. 6, FIG. 7. FIG. 6, FIG. 7 each shows a memory array in which the diagnosis area 41 is composed of n rows and k columns.

The diagnosis area 41 is divided into a plurality of Row areas 41-i in which the respective areas do not overlap to each other, and each of the Row areas 41-i is divided into a plurality of Cell areas 41-ij in which the respective areas do not overlap to each other.

In addition the Cell area 41-ij is configured to have any size of a data bus width size, a byte size and a word size of the memory, and sizes of integral multiples of the byte size and the word size. That is, the Cell area 41-ij is composed of memory cells of a plurality of bits.

In addition, the size of the Row area 41-i is set in the range which is not less than an integral multiple of the size of the Cell area 41-ij and not more than ½ of the size of the diagnosis area 41.

The memory fault diagnostic method of the present invention is composed of two hierarchies of diagnoses of the diagnoses in a Row area to diagnose with respect to all the combinations of a set of the Cell areas 41 in the Row area 41-i, and the diagnoses between Row areas to diagnose with respect to all the combinations of a set of Row areas 41 in the diagnosis area 41.

FIG. 6, with respect to a set of Cell areas 41, shows a Cell area 41-13 and a Cell area 41-1k as a set thereof, for example, and FIG. 7 shows a Row area 41-1 and a Row area 41-n-1 as a set thereof.

Next, the diagnosis in a Row area will be described. In the diagnosis in a Row area, a predetermined test pattern is written into and read out from a set of Cell areas, and whether or not the read out values of respective Cell areas are expectation values of the respective Cell areas is determined by comparison.

Figure 10A:
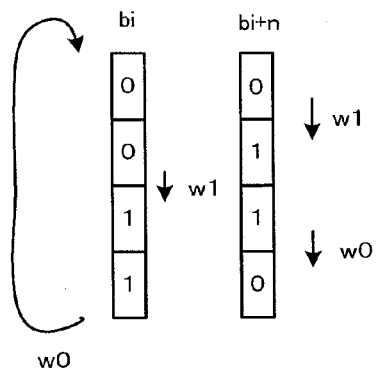
FIGS. 10A, 10B, and 10C Diagrams for describing examples of test patterns.
Figure 10B:
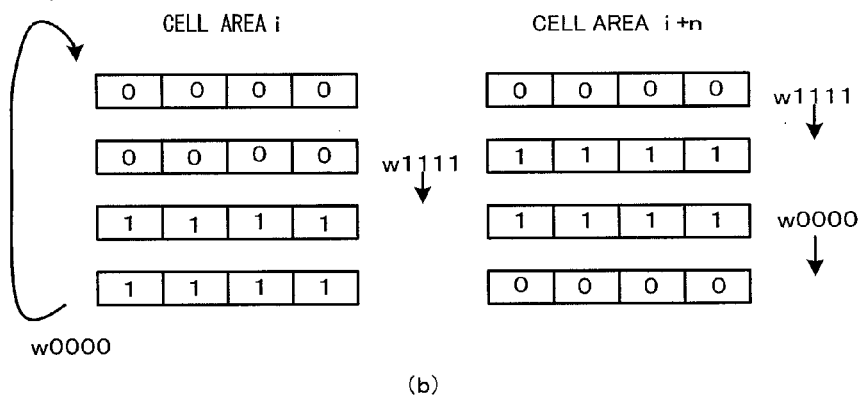
Figure 10C:
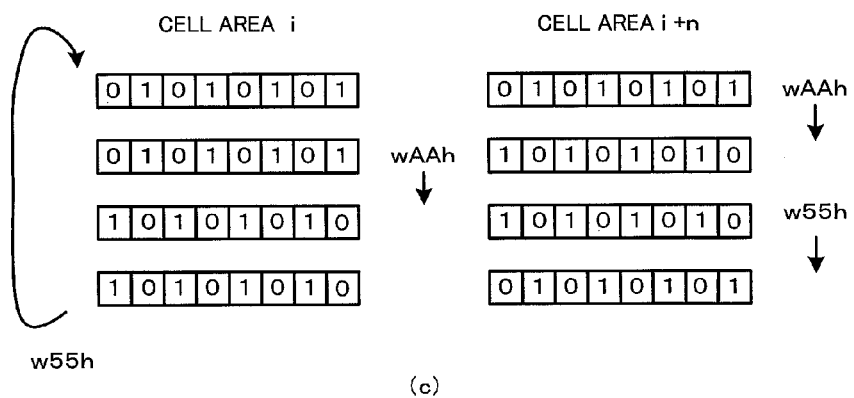

Regarding the test patterns, as shown in FIG. 10A, with respect to bit data at the corresponding positions of a set of areas, if the patterns thereof are in the inversion relation to each other, any combinations may be used. For example, four kinds in which two different patterns are combined are used, such as a combination in which a test pattern of 4 bits in the Cell area i is composed of all 0 and the inverted test pattern thereof is composed of all 1 as shown in FIG. 10B, or a combination in which a test pattern is 55h and the inverted test pattern is AAh, as shown in FIG. 10C.

In the diagnosis in a Row area, memory fault diagnostic processings are performed for all the combinations of a set of Cell areas which can be enabled in a Row area. By this diagnosis, in addition to a memory fault in each Cell area unit, all patterns of memory faults including a coupling fault at a Cell area unit in a Row area can be detected.

In addition, the diagnosis in a Row area is performed for all the Row areas 41-$i$ in the diagnosis area 41. By this means, a memory fault can be detected for all the memory cells 404*i* in the diagnosis area 41, and all patterns of memory faults including a coupling fault at a Cell area 41-$ij$ unit in each Row area can be detected.

Next, the diagnosis between Row areas will be described. In the diagnosis between Row areas, a predetermined test pattern is written into and read out from a set of Row areas, and whether or not the read out values of the respective Row areas are expectation values of the respective Row areas is determined by comparison.

Regarding the test patterns, similarly as in the diagnosis in a Row area, as shown in FIG. 10B, or C, with respect to bit data at the corresponding positions of a set of areas, if the patterns thereof are in the inversion relation to each other, any combinations may be used. For example, four kinds in which two different patterns are combined are used, such as a combination in which a test pattern of 4 bits in the Cell area i is composed of all 0 and the inverted test pattern thereof is composed of all 1 as shown in FIG. 10B, or a combination in which a test pattern is 55h and the inverted test pattern is AAh, as shown in FIG. 10C.

In the diagnosis between Row areas, memory fault diagnostic processings are performed for all the combinations of a set of Row areas which can be enabled in the diagnosis area 41. By this diagnosis, in addition to a memory fault in each Row area unit, all patterns of memory faults including a coupling fault at a Row area unit in the diagnosis area 41 can be detected.

In addition, the diagnosis between Row areas is performed for all the Row areas 41-$i$ in the diagnosis area 41. By this means, a memory fault can be detected for all the memory cells 404*i* in the diagnosis area 41, and all patterns of memory faults including a coupling fault at a Row area 41-$i$ unit in the diagnosis area 41 can be detected.

Figure 8:
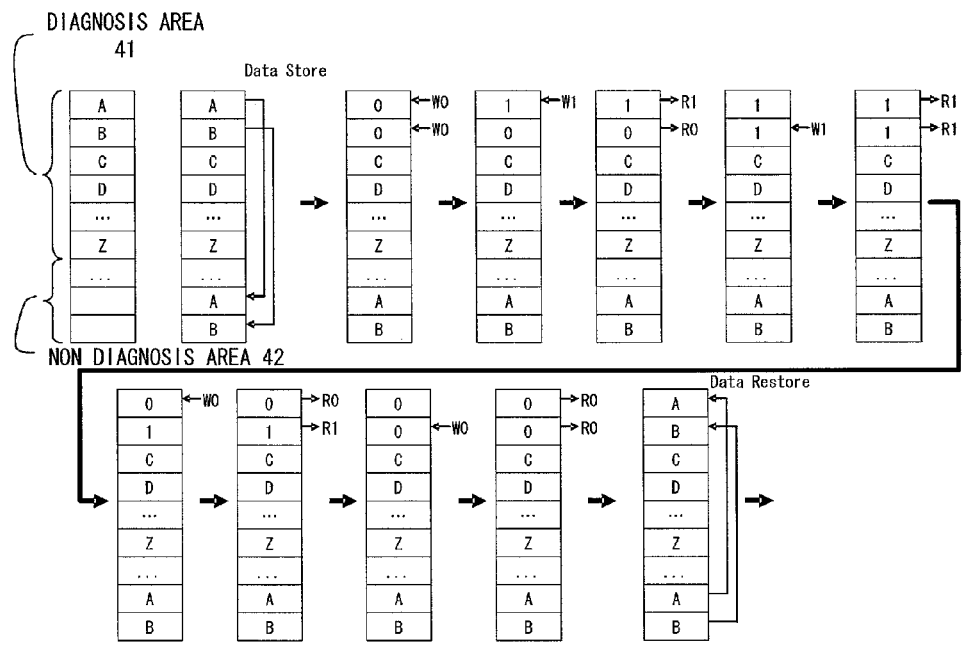
FIG. 8 A diagram for describing a memory diagnostic operation of the first embodiment.

Next, the diagnostic processing operations of the diagnosis in a Row area and the diagnosis between Row areas will be described with reference to FIG. 8. FIG. 8 describes that out of four kinds of combinations of the test patterns, as shown in FIG. 10A, the areas are described as A, B, C, . . . , and one bit representing the state of each of the areas is described as the test pattern.

In FIG. 8, to begin with, if a set of a Cell area A and a Cell area B is designated, save processing of the data of these areas to the non diagnosis area 42 is performed (Data Store).

Next, 0 is written into the set of the Cell area A and the Cell area B (W0). And, next, (0→) 1 is written into only the Cell area A (W1), and with respect to the written result, the data of the respective areas are read out (the Cell area A is R1, the Cell area B is R0), the read out values of the set of the respective Cell areas are obtained and compared with expectation values of the respective Cell areas, and thereby whether or not the read out values are correct is determined. In the case of discordance, the areas of this combination are determined to be in "fault". In the case of accordance, the processing moves to writing next data.

As the next data, (0→) 1 is written into the Cell area B (W1). And the data of the set of the areas are read out (the Cell area A is R1, the Cell area B is R1), and the read out values of the set of the respective areas are obtained and compared with expectation values of the respective areas, and thereby whether or not the read out values are correct is determined. In the case of discordance, the areas of this combination are determined to be in "fault". In the case of accordance, the processing moves to writing next data.

As the next data, (1→) 0 is written into the Cell area A (W0). And the data of the set of the areas are read out (the Cell area A is R0, the Cell area B is R1), and the read out values of the set of the respective Cell areas are obtained and compared with expectation values of the respective Cell areas, and thereby whether or not the read out values are correct is determined.

In the case of discordance, the areas of this combination are determined to be in "fault". In the case of accordance, the processing moves to writing next data.

As the next data, (1→) 0 is written into the Cell area B (W0). And the data of the set of the areas are read out (the Cell area A is R0, the Cell area B is R0), and the read out values of the set of the respective Cell areas are obtained and compared with expectation values of the respective Cell areas, and thereby whether or not the read out values are correct is determined.

In the case of discordance, the areas of this combination are determined to be in "fault". In the case of accordance, the data stored in the save area are written back into the set of the Cell area A and the Cell area B (Data Restore).

As described above, in a diagnostic cycle between two areas, three kinds of processings of the Data Store processing, the Read/Write check processing for the combination of four kinds of test data, and the Data Restore processing are executed, and then the diagnostic cycles are executed in the same manner till the last combination areas.

With respect to the diagnosis between Row areas, since the operation thereof is similar except that the area size thereof is different from that of the diagnosis in a Row area, the detail thereof will be omitted. In addition, with respect to the diagnosis between Row areas and the diagnosis in a Row area, the order of the diagnoses and the combination thereof are indifferent.

In the present embodiment, since the areas which are saved to the non diagnosis area 42 in a diagnostic cycle are limited to a set of Cell areas or a set of Row areas, it becomes possible to set the memory fault diagnostic processing (a diagnostic cycle from Data Store to Data Restore) described in FIG. 4 within one control cycle Ti.

In addition, in case that the execution time of the application is fixed, the interim time tdi can be set as a fixed value, but when it is assumed that the interim time tdi is variable and can not be set within one control cycle Ti, the interim time tdi is obtained each time the application ends.

Furthermore, the following diagnosis can be executed at the time of the diagnosis in a Row and at the time of the diagnosis between Rows. That is, a remaining interim time is obtained each time the diagnosis in one combination of patterns (data) in a diagnostic cycle ends, and in case that the remaining interim time becomes not more than a predetermined diagnostic time, the diagnosis in the next combination is temporarily halted and its diagnostic sequence number is stored, and in the next control cycle Ti, at the time point when the application ends, the diagnosis is started from the next diagnostic sequence number.

Figure 9:
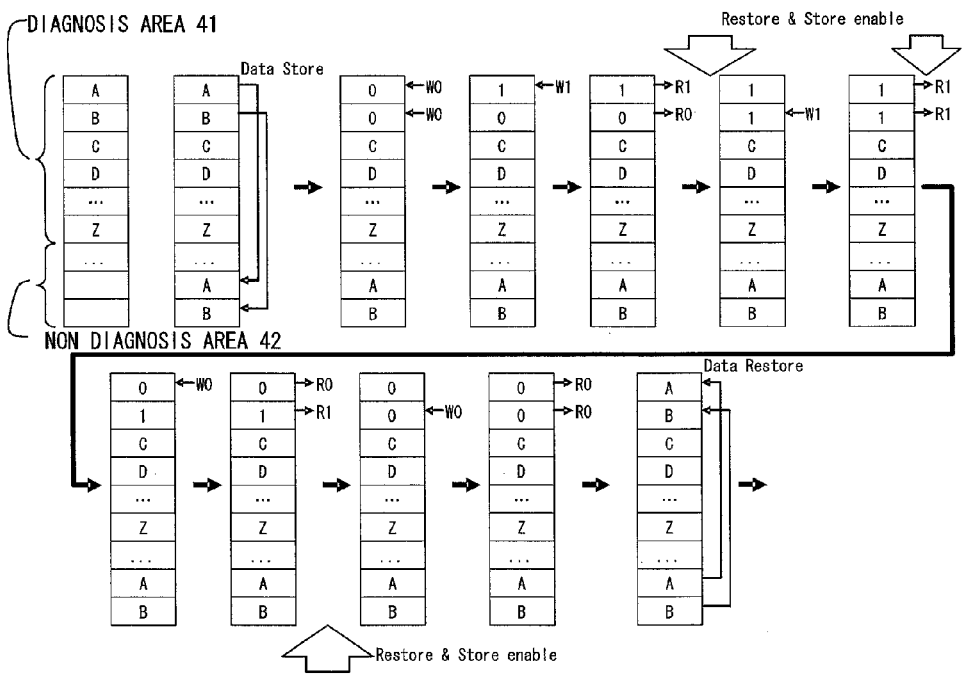
FIG. 9 A diagram for describing a halt processing operation of the memory diagnosis of the first embodiment.

The timing of halting the diagnosis in this case can be determined at three reading timings in the diagnostic cycle which are shown by Restore&Store enables shown by arrows in FIG. 9. That is, the Written data are Read, and after the comparison processing with expectation values ends, the memory fault diagnostic processing is halted, and the data in these areas which have been temporarily saved are Restored from the non diagnosis area 42, and then the application is started again.

And in the interim time tdi in the next control cycle Ti after the application ends, data are Written from the diagnostic sequence number after halting, and the diagnostic cycle is started.

In addition, since the application processing is not operated at all during the memory fault diagnostic processing, it is not necessary to execute the application processing at the diagnosis area 41 side.

Next, a method for setting a size of the Row area 41-$i$ and a size of the Cell area 41-$ij$ so as to minimize a diagnostic time as the memory fault diagnostic device 10 will be described.

In the scheme in which simply the program required for the application processing and the data are all copied into the non diagnosis area, and the application is executed in the non diagnosis area, it is possible to make an memory area relating to a diagnostic cycle in the memory diagnosis small, but there is a defect that the number of the combinations in the memory diagnosis becomes vast in return.

In order to prevent this defect, in the present embodiment, the diagnostic processing is used in which the diagnosis area 41 is divided into two hierarchies of the Row areas and the Cell areas.

In the present embodiment, a size range of the Row area is an integer multiple of a size of the Cell area, and its range is determined as, Cell area size×2≤Row area size≤diagnosis area size×½, but the number of the combinations of a set of Cell areas is proportional to the square of the Row area size.

For this reason, if the size of a Row area becomes large, the number of the combinations of Cell areas increases, the processing time for the diagnosis in a Row area increases, and it becomes difficult to end the Data Store and the Date Restore processings within an interim time in a control cycle.

On the other hand, since the number of the combinations of a set of Row areas in the diagnosis between Row areas is inversely proportional to a Row area size, the smaller the Row area size is made, the more the number of Row areas in the diagnosis area 41 increases, and as a result, the number of the combinations for the diagnosis between Row areas rapidly increases, and the total processing time for the diagnosis between Row areas expands.

Hereinafter, the relation among a time of the diagnosis between Row areas, a time of the diagnosis in a Row area, a diagnosis area size, a Row area size, and a Cell area size, in order to minimize a memory fault diagnostic time, will be obtained.

A time $T_{Brow}$ of the diagnosis between Row areas is obtained by the following expression with reference to FIG. 8.

$$T_{Brow}=(A)\cdot(B)\cdot(C)\cdot(D)$$

Here, (A), (B), (C), (D) are values defined in the following, (A) . . . the number of times of Read/Write per diagnostic cycle (Date Store–Data Restore) of the diagnosis between Rows in FIG. 8, (B) . . . the total number of the combinations of a set of Row areas, (C) . . . the number of times of memory access in a Row area, and (D) . . . a memory access time per access=1/the number of clocks, here, if that m=diagnosis area size/Row area size is determined, (B) becomes as $$(B)=m\cdot(m-1)/2.$$

In addition, (C) is expressed as (C)=(Row area size/Cell area size)·the number of access cycles per Cell area.

Here, in case that m is a sufficiently large number, since (B) can be approximated to $m^2/2$, the time $T_{Brow}$ of the diagnosis between Row areas is obtained by the following (Numerical expression 1)

Numerical Expression 1

Time of the diagnosis between Row areas=number of RW times per diagnostic cycle×(diagnosis area size)²×number of access cycles per Cell area/(2× Row area size×Cell area size×number of clocks)

Similarly, a time $T_{Irow}$ of the diagnosis in a Row area is obtained by the following expression.

$$T_{Irow}=(A)\cdot(B)\cdot(C)\cdot(D)\cdot(E)$$

Here, (A), (B), (C), (D), (E) are values defined in the following, (A) . . . the number of times of Read/Write per diagnostic cycle (Date Store–Data Restore) of the diagnosis in a Row in FIG. 8, (B) . . . the total number of the combinations of a set of Cell areas, (C) . . . the number of times of memory access in a Cell area, (D) . . . a memory access time per access=1/the number of clocks, and (E) . . . the number of the Row areas in the diagnosis area, here, if that n=Row area size/Cell area size is determined, (B) becomes as $$(B)=n\cdot(n-1)/2.$$

In addition (C) is expressed as (C)=(Row area size/Cell area size)·the number of access cycles per Cell area.

Here, in case that n is a sufficiently large number, since (B) can be approximated to $n^2/2$, the time $T_{Irow}$ of the diagnosis in a Row area is obtained by the following (Numerical expression 2).

Numerical Expression 2

Time of the diagnosis in a Row area=number of RW times per diagnostic cycle×Row area size×diagnosis area size×number of access cycles per Cell area/(2×(Cell area size)²×number of clocks)

Here, in case that the time $T_{Irow}$ (total necessary time) of the diagnosis in a Row area is used as a target for the allowable diagnostic time Tav which can be spent for the memory fault diagnostic processing, the relation of the following (Numerical expression 3) comes into effect among the Row area size, the Cell area size, the diagnosis area size, and the allowable diagnostic time.

Numerical Expression 3

Row area size≤2×(Cell area size)²×number of clocks× allowable diagnostic time/(number of RW times per diagnostic cycle×diagnosis area size×number of access cycles per Cell area)

That is, the Row area size satisfies (Numerical expression 3), and thereby the time $T_{Irow}$ of the diagnosis in a Row area can be made lower than the allowable diagnostic time Tav.

In addition, in the case of a method of executing memory fault diagnosis for the whole diagnosis area by using only the diagnosis in a Row area, without hierarchizing the diagnosis area as in the present embodiment, a diagnostic time becomes as in the following (Numerical expression 4).

Numerical Expression 4

Diagnostic time(conventional)=number of RW times per diagnostic cycle×(diagnosis area size)²×number of access cycles per Cell area/(2×(Cell area size)²×number of clocks)

Accordingly, if (Numerical expression 1), (Numerical expression 2) are compared with (Numerical expression 4), it is found that in the conventional fault diagnostic method, the processing time of (Row area size/Cell area size) times as many as the time $T_{Brow}$ of the diagnosis between Row areas, and the processing time of (diagnosis area size/Row area size) times as many as the time $T_{Irow}$ of the diagnosis in a Row area are required.

On the other hand, the memory diagnostic time in the present embodiment becomes a time of the sum of the time $T_{Brow}$ of the diagnosis between Row areas and the time $T_{Irow}$ of the diagnosis in a Row area. As shown in (Numerical expression 1), (Numerical expression 2), the time $T_{Brow}$ of the diagnosis between Row areas is in the inversely proportional relation with the Row area size, and the time $T_{Irow}$ of the diagnosis in a Row area is in the proportional relation with the Row area size. For this reason, it is in a case in which the time $T_{Brow}$ of the diagnosis between Row areas=the time $T_{Irow}$ of the diagnosis in a Row area that the memory diagnostic time becomes minimum.

The Row area size which satisfies this relation is obtained from (Numerical expression 1), (Numerical expression 2) as in the following (Numerical expression 5).

Numerical Expression 5

$$\text{Row area size} = \sqrt{\text{diagnosis area size} \times \text{Cell area size}}$$

Generally, since memory sizes are expressed by a multiple of 2, in case that (Numerical expression 5) does not become a multiple of 2, an optimum value which is closest to the value of (Numerical expression 5) and the Row area can obtain, inevitably exists between ½ times and 2 times of the Row area size of (Numerical expression 5).

Accordingly, the Row area size of the present embodiment in which the memory diagnostic time is minimized is generally expressed by the following (Numerical expression 6).

Numerical Expression 6

$$\tfrac{1}{2}\sqrt{\text{diagnosis area size} \times \text{Cell area size}} \leq \text{Row area size} \leq 2\sqrt{\text{diagnosis area size} \times \text{Cell area size}}$$

In addition, as a method of determining a Row area size, not by the method of (Numerical expression 3) and (Numerical expression 6) types, but a configuration in accordance with a physical (hardware) configuration of a memory can also be used.

Specifically, it is possible to use a configuration in which a Row area size is conformed to a memory size which is discriminated by a Row address in a physical memory as shown in FIG. 5.

Inside a DRAM, memory cells are arrayed in a lattice shape of rows (Row) and columns (Column) as shown in FIG. 5. In case that an external circuit of a DRAM reads and writes the memory space, an object to be read and written is designates by an address. Address information is divided into a row address and a column address inside the DRAM. A coupling fault of the DRAM in the address area has a property that it occurs more easily between the row addresses, and between the column addresses, because of its structure.

For this reason, in a memory device of FIG. 5 in which the column (Column) address is expressed by 0th to 7th bits, and the row (Row) address is expressed by 8th to 18th bits, by making the Row area size 256 bytes ($=2^8$), the diagnosis in a Row area can be executed by combination operations of the column addresses, and the diagnosis between Rows can be executed by combination operation of the row addresses.

Therefore, according to the present embodiment, in the memory fault diagnostic device, the diagnosis area is divided into the Row areas and the Cell areas, and the memory fault diagnosis is executed by two hierarchies of the diagnosis in a Row area and the diagnosis between Row areas, and thereby a cycle of the memory fault diagnosis can be set within the interim time in the control cycle of the constant cycle application processing.

In addition, since the execution of the application processing in the save area is rendered unnecessary, the application processing is facilitated, and in addition, since a time to copy a set of diagnosis areas to the save area can be set within the interim time, it is possible to provide a memory fault diagnostic device which does not disturb the execution of an application processing.

Second Embodiment

Figure 11:
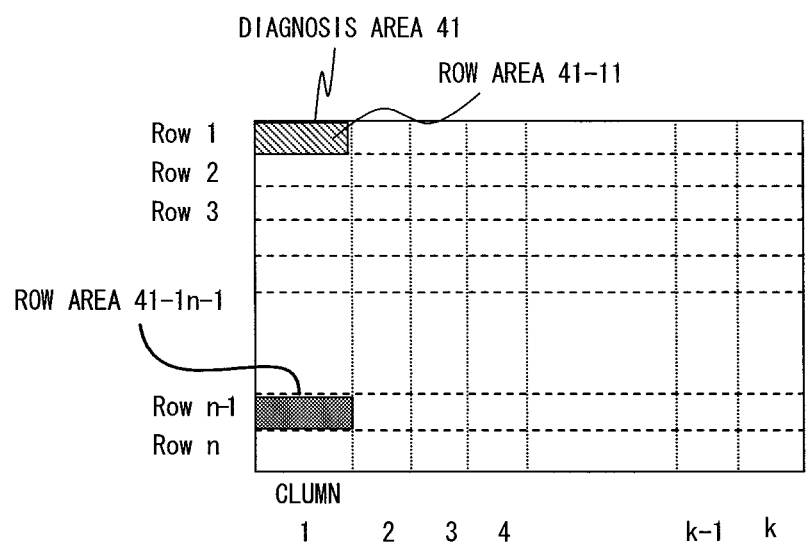
FIG. 11 A diagram for describing setting of an area for the diagnosis between Row areas of a second embodiment and its operation.

Next, a second embodiment of a memory fault diagnostic device according to the present invention will be described with reference to FIG. 11. With respect to the respective portions of the second embodiment, the same symbols are given to the same portions as in the first embodiment, and the description thereof will be omitted.

The point in which the second embodiment is different from the first embodiment is as follows. With respect to the Row area size, in the first embodiment, the whole column width is determined as an area thereof in the column direction of the memory, but in the second embodiment, only one leading Cell area is determined as an area thereof in the column direction for each row address in the physical address of the memory, and thereby, in the diagnosis between Row areas, the number of accesses in the row direction can be reduced by the number of Row area size/Cell area size.

In the present embodiment, the diagnosis range in the Read/Write diagnosis in the diagnosis between Row areas is reduced. However, since the diagnosis of the diagnosis area 41 is executed in the diagnosis in a Row area, a fault for a specific address of the memory can be detected, in the same manner as in the first embodiment.

In addition, with respect to a coupling fault across Row areas which can not diagnosed in the diagnose in a Row area, in case that a fault generation source is an address line, for example, since the Read/Write diagnosis is executed between the Cell areas across the Row area by the diagnosis between Row areas, the coupling fault in the address area can be detected.

As described above, the present embodiment makes it an object to provide a memory fault diagnostic device, a memory fault diagnostic method which can diagnose a memory fault at a minimum time using an interim time after the execution of an application in a predetermined control cycle, and can minimize a fault diagnostic time for the whole memories in a diagnostic object area.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory fault diagnostic method to diagnose a fault of a memory using an interim time after execution of an application in a predetermined control cycle, wherein:

an area of the memory comprises a predetermined diagnosis area which becomes a diagnostic object, and a non diagnosis area except for the diagnostic object which is not used in the application and the memory fault diagnosis;

the diagnosis area is divided into a plurality of Row areas in which the respective areas do not overlap to each other, and each of the Row areas is divided into a plurality of Cell areas in which the respective areas do not overlap to each other, and the Cell area is configured to have any size of a data bus width size, a byte size, a word size, and sizes of integral multiples of the byte size and the word size of the memory; and the Row area size is set not less than an integral multiple of the Cell area size and not more than ½ of the diagnosis area, and is set to a size in which a time of the diagnosis in a Row area becomes equal to a time of the diagnosis between Row areas;

the memory fault diagnostic method comprising operating a computer to perform:

a diagnostic step in a Row area to diagnose with respect to all the combinations of a set of Cell areas in the Row area; and a diagnostic step between Row areas to diagnose with respect to all the combinations of a set of the Row areas in the diagnosis area;

wherein the diagnostic step in a Row area comprises:

a step to save data of a predetermined set of Cell areas to the non diagnosis area at a timing when the execution of the application ends in the control cycle;

a step, with respect to a set of the Cell areas, to write and generate four kinds of combinations of different two patterns in which patterns at the same bit position are in the inversion relation, to read out data of the relevant Cell areas, each time data is written, and to compare the values of the relevant Cell areas and expectation values of the relevant Cell areas to thereby determine whether or not these value are the relevant expectation values;

a step to write back the data which has been saved in the non diagnosis area to a set of the Cell areas, in case that, as a result of comparison, these values are the expectation values; and a step to determine that the relevant set of Cell areas are in "fault" in case that, as a result of comparison, these values are not the expectation values; and wherein the diagnostic step between Row areas comprises:

a step to save data of a predetermined set of Row areas to the non diagnosis area at a timing when the execution of the application ends in the control cycle;

a step, with respect to a set of the Row areas, to write and generate four kinds of combinations of different two patterns in which patterns at the same bit position are in the inversion relation, to read out data of the relevant Row areas, each time data is written, and to compare the read out values of a set of the relevant Row areas with expectation values of the relevant Row areas to thereby determine whether or not these value are the relevant expectation values;

a step to write back the data which has been saved in the non diagnosis area to a set of the Row areas, in case that, as a result of comparison, these values are the expectation values; and a step to determine that the relevant set of Row areas are in "fault" in case that, as a result of comparison, these values are not the expectation values.

2. The memory fault diagnostic method as recited in claim 1 wherein: the Row area size is given by the following (Numerical expression 1) from a predetermined allowable diagnostic time in the diagnosis in a Row area

[Numerical expression 1]

$$\text{Row area size} \leq 2 \times (\text{Cell area size})^2 \times \text{number of clocks} \times \text{allowable diagnostic time/number of } RW \text{ times per diagnostic cycle} \times \text{diagnosis area size} \times \text{number of access cycles per Cell area.}$$

3. The memory fault diagnostic method as recited in claim 1 wherein: a size range of the Row area is given by the following (Numerical expression 2)

[Numerical Expression 2]

$$\tfrac{1}{2}\sqrt{\text{diagnosis area size} \times \text{Cell area size}} \leq \text{Row area size}$$
$$2\sqrt{\text{diagnosis area size}} \leq \times \text{Cell area size.}$$

4. The memory fault diagnostic method as recited in claim 1 wherein: a size of the Row area is set to a width size of a row address in a physical address of the memory.

5. The memory fault diagnostic method as recited in claim 1 wherein:

with respect to the Row area size, only one leading Cell area in the column direction is determined as the relevant Row area for each row address in a physical address of the memory, and in the diagnosis between Row areas, access in the row direction is reduced by the number of (Row area size/Cell area size).

6. The memory fault diagnostic method as recited in claim 1 wherein:

the interim time is set as a fixed value if an execution time of the application is fixed;

the interim time is obtained each time the application ends in case that the execution time of the application is variable;

furthermore, at the time of the diagnosis in a Row and at the time of the diagnosis between Rows, a remaining interim time is obtained each time the diagnosis in a combination of pattern data ends in a diagnostic cycle of the pattern data of the four kinds of combinations;

in case that the remaining interim time becomes not more than a predetermined diagnostic time, the diagnosis in the next combination is temporarily halted, and its diagnostic sequence number is stored; and in the next control cycle, at the time point when the application ends, the diagnosis is started from the next diagnostic sequence number.

7. In a memory fault diagnostic device to diagnose a fault of a memory using an interim time after execution of an application in a predetermined control cycle, wherein:

an area of the memory comprises a predetermined diagnosis area which becomes a diagnostic object, and a non diagnosis area except for the diagnostic object which is not used in the application and the memory fault diagnosis;

the diagnosis area is divided into a plurality of Row areas in which the respective areas do not overlap to each other, and each of the Row areas is divided into a plurality of Cell areas in which the respective areas do not overlap to each other, and the Cell area is configured to have any size of a data bus width size, a byte size, a word size, and sizes of integral multiples of the byte size and the word size of the memory; and the Row area size is set not less than an integral multiple of the Cell area size and not more than ½ of the diagnosis area, and is set to a size in which a time of the diagnosis in a Row area becomes equal to a time of the diagnosis between Row areas;

the memory fault diagnostic device comprising:

diagnostic means in a Row area to diagnose with respect to all the combinations of a set of Cell areas in the Row area; and diagnostic means between Row areas to diagnose with respect to all the combinations of a set of the Row areas in the diagnosis area;

wherein the diagnostic means in a Row area:

saves data of a predetermined set of Cell areas to the non diagnosis area at a timing when the execution of the application ends in the control cycle;

with respect to a set of the initialized Cell areas, writes and generates four kinds of combinations of different two patterns in which patterns at the same bit position are in the inversion relation, reads out data of the relevant Cell areas, each time data is written, and compares the read out values of the relevant Cell areas with expectation values of the relevant Cell areas to thereby determine whether or not these value are the relevant expectation values;

writes back the data which has been saved in the non diagnosis area to a set of the Cell areas, in case that, as a result of comparison, these values are the expectation values; and determines that the relevant set of Cell areas are in "fault", in case that, as a result of comparison, these values are not the expectation values; and wherein the diagnostic means between Row areas:

saves data of a predetermined set of Row areas to the non diagnosis area at a timing when the execution of the application ends in the control cycle;

with respect to a set of the Row areas, writes and generates four kinds of combinations of different two patterns in which patterns at the same bit position are in the inversion relation, reads out data of the relevant Row areas each time data is written, and compares the read out values of the relevant Row areas with expectation values of the relevant Row areas to thereby determine whether or not these value are the relevant expectation values;

writes back the data which has been saved in the non diagnosis area to a set of the Row areas, in case that, as a result of comparison, these values are the expectation values; and determines that the relevant set of Row areas are in "fault" in case that, as a result of comparison, these values are not the expectation values.

8. The memory fault diagnostic device as recited in claim 7 wherein: the Row area size is given by the following (Numerical expression 3) from a predetermined allowable diagnostic time in the diagnosis in a Row

[Numerical Expression 3]

$$\text{Row area size} \leq 2 \times (\text{Cell area size})^2 \times \text{number of clocks} \times \text{allowable diagnostic time}/\text{number of } RW \text{ times per diagnostic cycle} \times \text{diagnosis area size} \times \text{number of access cycles per Cell area}.$$

9. The memory fault diagnostic device as recited in claim 7 wherein: a size range of the Row area is given by the following (Numerical expression 4)

[Numerical Expression 4]

$$\tfrac{1}{2}\sqrt{\text{diagnosis area size} \times \text{Cell area size}} \leq \text{Row area size} \leq 2\sqrt{\text{diagnosis area size} \times \text{Cell area size}}.$$

10. The memory fault diagnostic device as recited in claim 7 wherein: a size of the Row area is set to a width size of a row address in a physical address of the memory.

11. The memory fault diagnostic device as recited in claim 7 wherein: with respect to the Row area size, only one leading Cell area in the column direction is determined as the relevant Row area for each row address in a physical address of the memory, and in the diagnosis between Row areas, access in the row direction is reduced by the number of (Row area size/Cell area size).

12. The memory fault diagnostic device as recited in claim 7 wherein:

the interim time is set as a fixed value if an execution time of the application is fixed;

the interim time is obtained each time the application ends in case that the execution time of the application is variable;

furthermore, at the time of the diagnosis in a Row and at the time of the diagnosis between Rows, a remaining interim time is obtained each time the diagnosis in a combination of pattern data ends in a diagnostic cycle of the pattern data of the four kinds of combinations;

in case that the remaining interim time becomes not more than a predetermined diagnostic time, the diagnosis in the next combination is temporarily halted, and its diagnostic sequence number is stored; and in the next control cycle, at the time point when the application ends, the diagnosis is started from the next diagnostic sequence number.

\* \* \* \* \*